US007233020B2

United States Patent
Park et al.

(10) Patent No.: US 7,233,020 B2
(45) Date of Patent: Jun. 19, 2007

(54) DESIGN FOR AN ORGANIC LIGHT-EMITTING DISPLAY THAT ELIMINATES DETERIORATION OF THE EMISSION LAYER DUE TO OUTGASSING FROM AN UNDERLYING LAYER

(75) Inventors: Joon-Young Park, Suwon-si (KR); Jang-Hyuk Kwon, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/947,344

(22) Filed: Sep. 23, 2004

(65) Prior Publication Data
US 2005/0110028 A1 May 26, 2005

(30) Foreign Application Priority Data
Nov. 25, 2003 (KR) ............... 10-2003-0084245

(51) Int. Cl.
*H01L 51/00* (2006.01)
(52) U.S. Cl. ............... 257/40; 257/213; 257/288; 257/347; 257/E51.022; 438/99
(58) Field of Classification Search .............. None
See application file for complete search history.

(56) References Cited

U.S. PATENT DOCUMENTS
6,420,834 B2 * 7/2002 Yamazaki et al.
6,781,162 B2 * 8/2004 Yamazaki et al.

FOREIGN PATENT DOCUMENTS
JP 2001-312223 11/2001

OTHER PUBLICATIONS
Korean Office Action of the Korean Patent Application No. 2003-84245, mailed on Feb. 21, 2006.

* cited by examiner

*Primary Examiner*—Leonardo Andujar
*Assistant Examiner*—Kevin Quinto
(74) *Attorney, Agent, or Firm*—Robert E. Bushell, Esq.

(57) ABSTRACT

An organic light-emitting display has a first pattern overlapping with one first electrode portion which overlaps with the via-hole. The first pattern is protruded upward as compared with the first electrode. The other first electrode portion on which the first pattern is not formed is exposed. An emission layer is located on the first electrode. A second pattern may be further formed around the first pattern. The second pattern is spaced apart from the first electrode and protruded upward as compared with the first electrode extended onto the via-hole insulating layer. The first pattern and the second pattern may be connected to each other. With this structure, deterioration of the organic emission layer can be prevented.

12 Claims, 12 Drawing Sheets

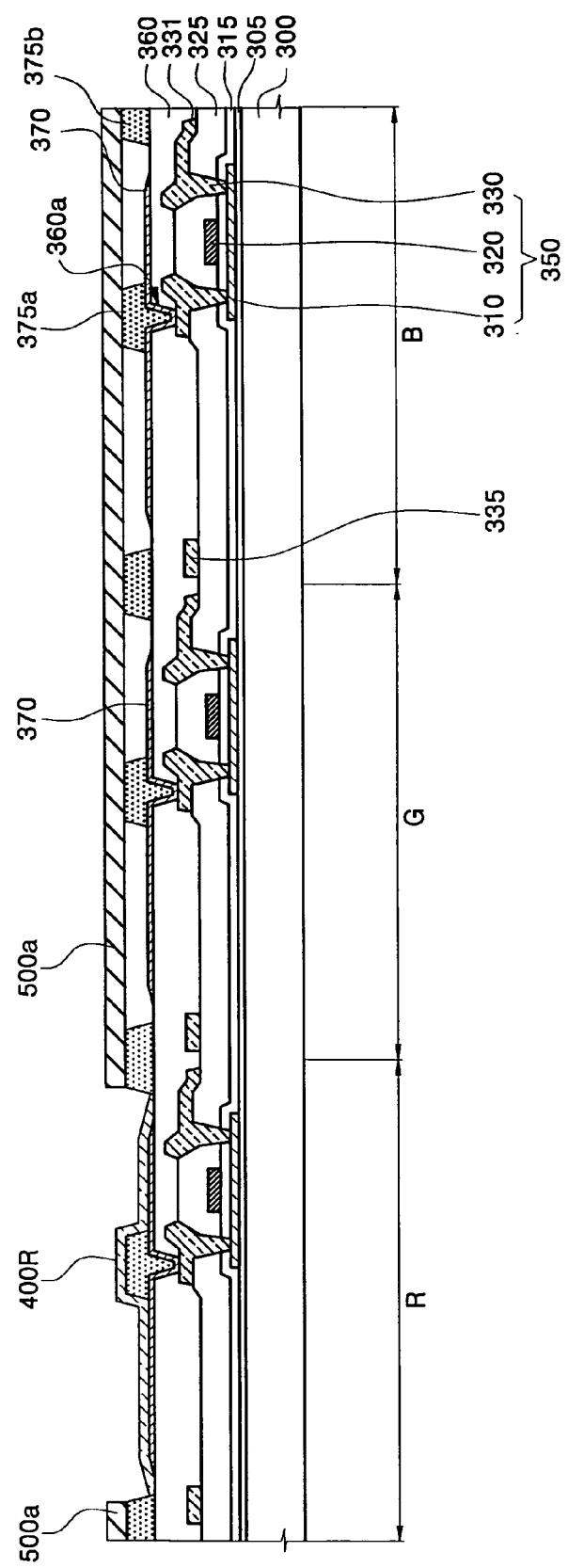

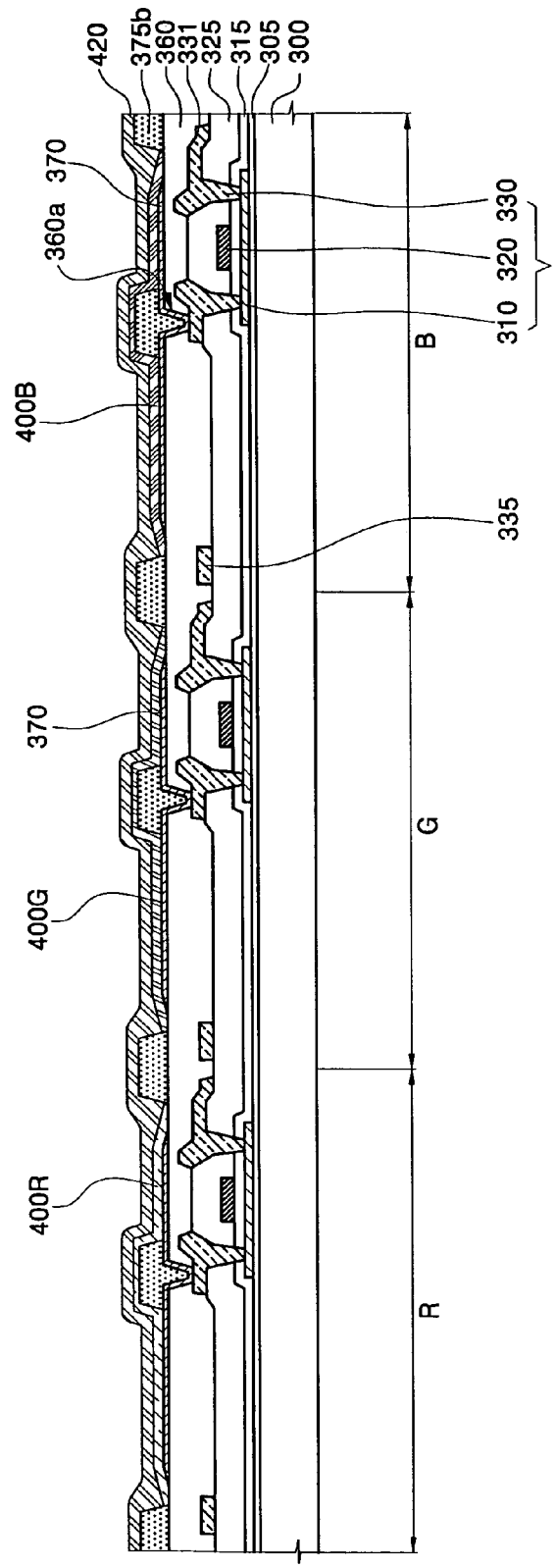

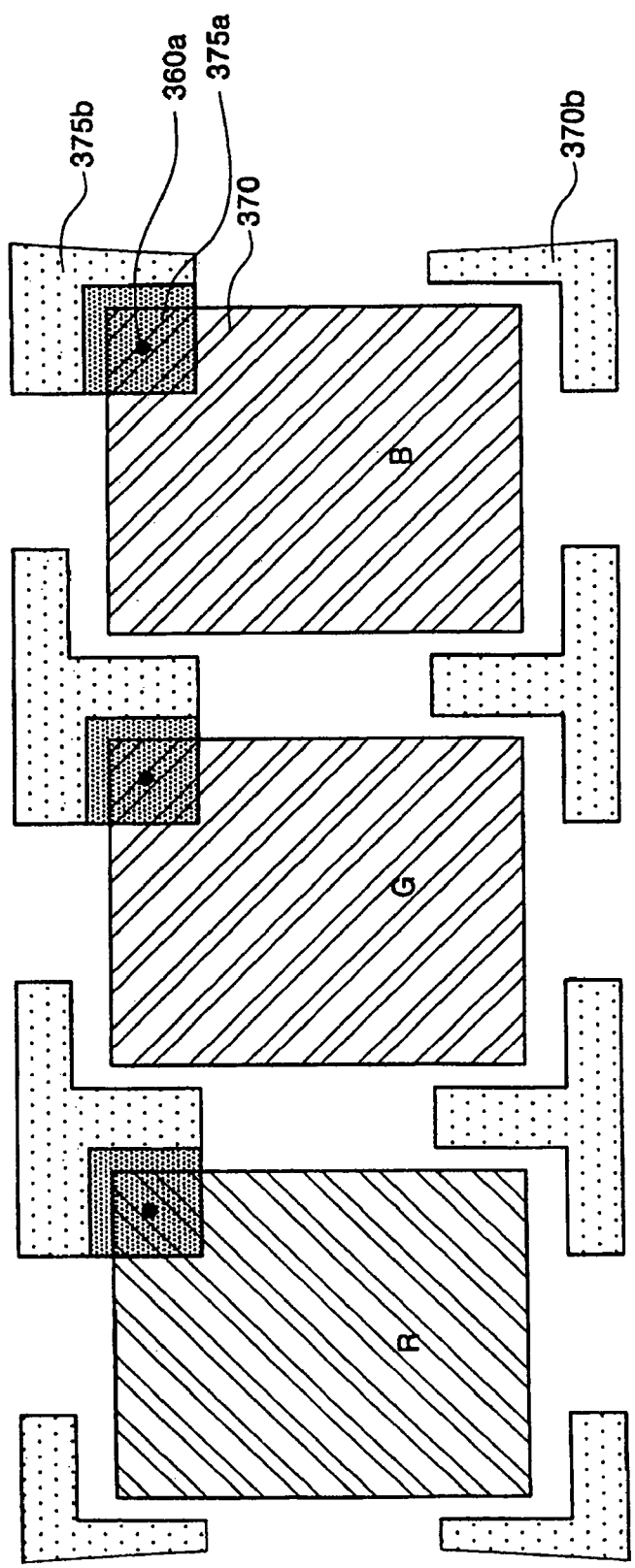

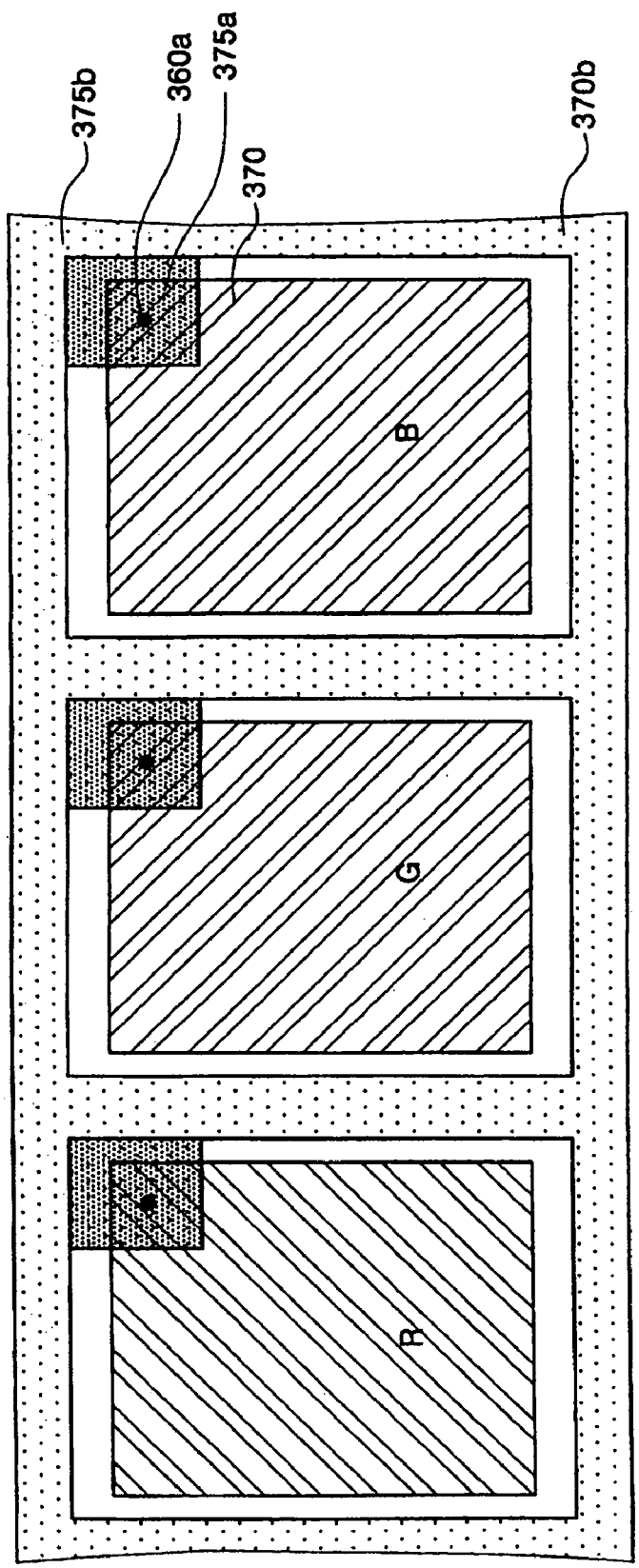

DESIGN FOR AN ORGANIC LIGHT-EMITTING DISPLAY THAT ELIMINATES DETERIORATION OF THE EMISSION LAYER DUE TO OUTGASSING FROM AN UNDERLYING LAYER

CLAIM OF PRIORITY

This application makes reference to, incorporates the same herein, and claims all benefits accruing under 35 U.S.C. §119 from an application for ORGANIC LIGHT-EMITTING DISPLAY earlier filed in the Korean Intellectual Property Office on 25 Nov. 2003 and there duly assigned Serial No. 2003-84245.

BACKGROUND OF THE INVENTION

1. Field of the Invention

The present invention relates to an organic light-emitting display and, more particularly, to an active matrix organic light-emitting display.

2. Description of the Related Art

Generally, an organic light-emitting display, which is an emissive display device that electrically excites a fluorescent organic compound to emit light, is classified into a passive matrix display and an active matrix display depending on a method of driving N×M pixels arranged in a matrix form, where the active matrix organic light-emitting display has lower power consumption than the passive matrix organic light-emitting display so that it is appropriate to implement a large area and high resolution display.

FIG. 1 is a cross-sectional view for illustrating a conventional active matrix organic light-emitting display and a method of fabricating the same, in which only a unit pixel is shown.

Referring to FIG. 1, a buffer layer 105 is formed on a substrate 100. A thin film transistor (TFT) including an active layer 110, a gate insulating layer 120, a gate electrode 130, an interlayer 140 and source/drain electrodes 145 is formed on the buffer layer 105 of the substrate 100 by the typical method. A via-hole insulating layer 155 is formed on the entire surface of the substrate, and a via-hole 150 that exposes one of the source/drain electrodes 145 is formed in the via-hole insulating layer 155.

Next, a pixel electrode 170 that contacts with the source/drain electrode 145 exposed in the via-hole 150 is formed. Here, since the pixel electrode 170 is formed along the bottom and sidewall of the via-hole 150, it has a bent shape in the via-hole 150. Subsequently, a pixel defining layer 175 is formed that covers the pixel electrode 170 bent in the via-hole 150, wherein the pixel defining layer 175 is formed to have an opening 178 that exposes the pixel electrode 170 at a place spaced from the via-hole 150. Further, an organic emission layer 180 is formed on the pixel electrode 170 exposed in the opening 178, and a second electrode (i.e., an opposite electrode) 190 is formed on the organic emission layer 180.

In the case of forming the organic emission layer 180, the organic emission layer 180 is vulnerable to failure of layer formation at the edge of the bottom of the opening 178, that is, at the portion P where the pixel defining layer 175 and the pixel electrode 170 meet. This can cause deterioration of the organic emission layer 180, in driving the organic light-emitting display. Further, the organic emission layer 180 contacts with the pixel defining layer 175 at the edge of the opening 178. Generally, the pixel defining layer 175 is formed of an organic layer, wherein the organic layer is known to outgas at a high temperature. The outgassing can cause deterioration of the organic emission layer 180 in contact with the pixel defining layer 175.

FIG. 2 is a picture showing a failure occurred in an organic light-emitting display.

Referring to FIG. 2, due to the foregoing problems, it can be found that the organic emission layer is deteriorated along with the edge of the opening (b) located at the unit pixel region (a). This is also referred to as 'pixel shrinkage'. This significantly affects the yield of the organic light-emitting display.

SUMMARY OF THE INVENTION

It is therefore an aspect of the present invention to provide an improved organic light-emitting display.

It is further an aspect of the present invention provide an organic light-emitting display where deterioration of an organic emission layer is suppressed.

To achieve the above and other aspects, the present invention may be constructed with a substrate having a unit pixel region; a thin film transistor located on the unit pixel region, the thin film transistor having a source electrode and a drain electrode; a via-hole insulating layer located on the source electrode and the drain electrodes and having a via-hole that exposes one of the source electrode and the drain electrode; a first electrode overlapping with the via-hole insulating layer and contacting with the exposed one of the source electrode and the drain electrode in the via-hole, the first electrode having a first part and a second part, the first part including at least a portion overlapping with the via-hole; a first pattern formed on the first part of the first electrode and protruded upward as compared with the first electrode; and an emission layer located on the first electrode.

The first part of the first electrode includes the portion overlapping with the via-hole and a portion abutting on the via-hole.

The first pattern may be an organic layer. The organic layer may be selected from a group consisting of a benzocyclobutene (BCB) layer, an acrylic-based polymer layer and an imide-based polymer layer. The first pattern may be protruded by about 0.2 to 10 µm as compared with the second part of the first electrode. Further, the first pattern may have a tapered edge on the first electrode extended onto the via-hole insulating layer. The tapered edge may have a taper angle of 45 degrees or less.

The organic light-emitting display may further comprise a second pattern spaced apart from the first electrode, and protruded upward as compared with the second part of the first electrode.

The second pattern may be an organic layer. The organic layer may be selected from a group consisting of a BCB (benzocyclobutene) layer, an acrylic-based polymer layer and an imide-based polymer layer. The second pattern may be protruded by about 0.2 to 10 µm as compared with the second part of the first electrode.

The via-hole insulating layer may be an organic layer, an inorganic layer or a stacked layer thereof.

The first electrode may have a tapered edge. Further, a taper of the tapered edge is 20 degrees or less.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 4A to 4E are cross-sectional views for illustrating an organic light-emitting display and a method of fabricating the same according to a preferred embodiment of the present invention, taken along the line I–I' of FIG. 3.

FIGS. 5A to 5D are plan views showing an organic light-emitting display according to each of preferred embodiments of the present invention.

DETAILED DESCRIPTION OF THE PREFERRED EMBODIMENTS

Figure 1:
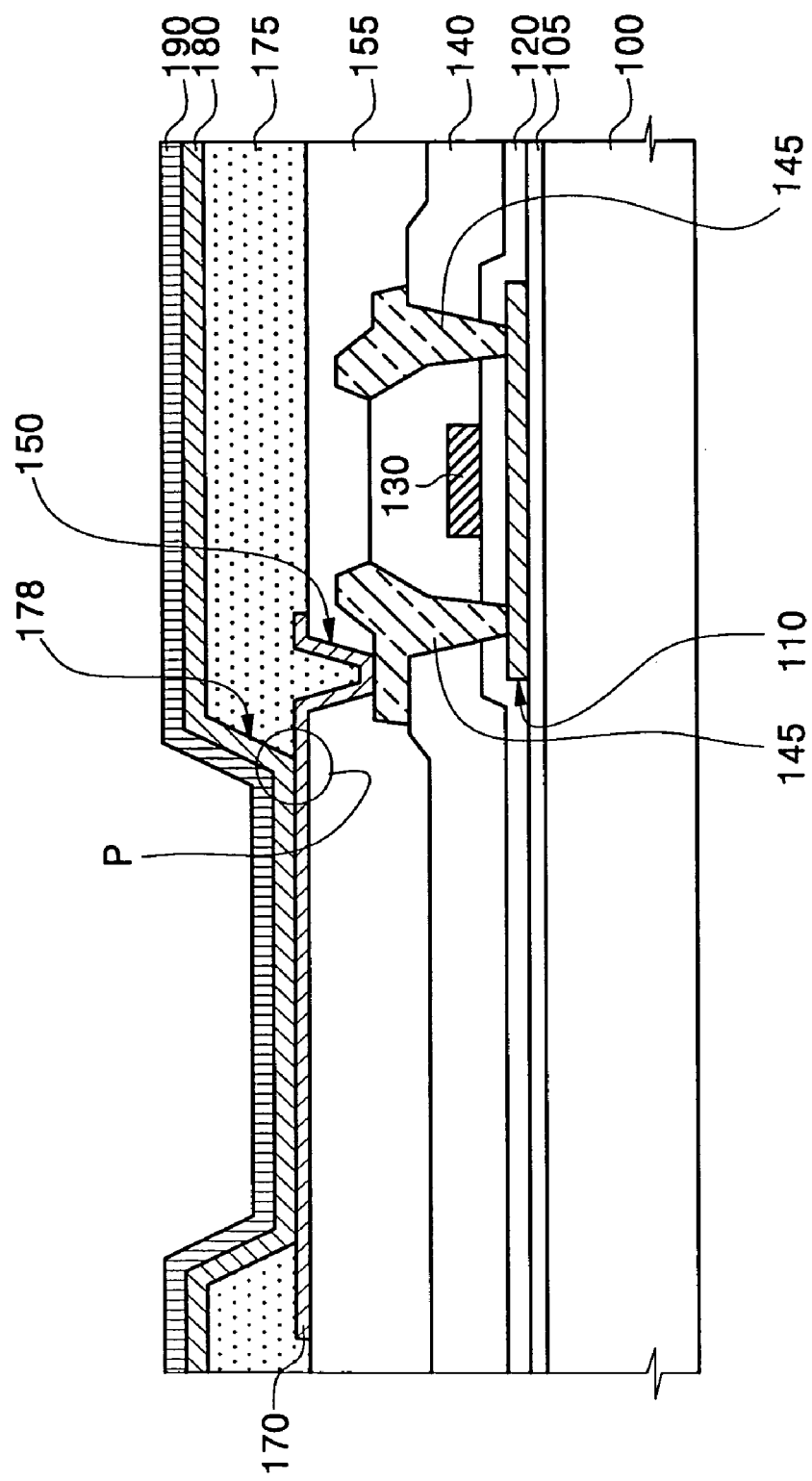
FIG. 1 is a cross-sectional view for illustrating a conventional active matrix organic light-emitting display and a method of fabricating the same.
Figure 2:
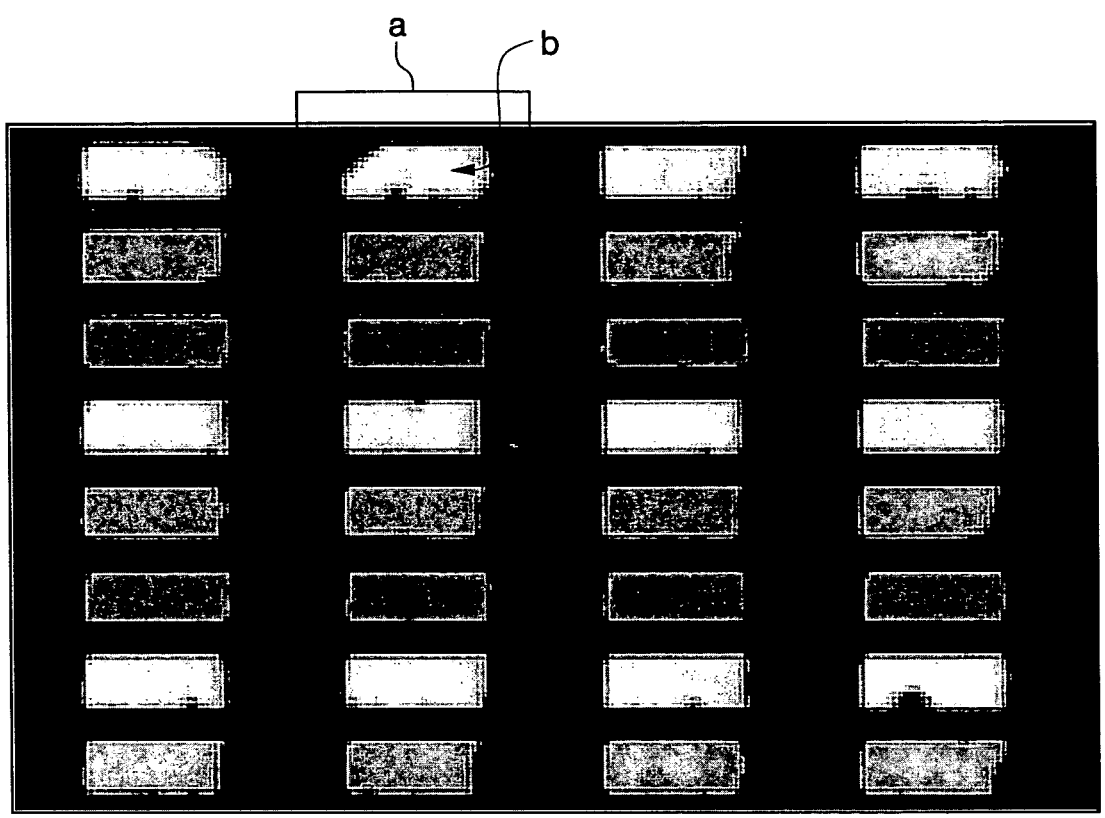
FIG. 2 is a picture showing a failure occurred in an organic light-emitting display.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, when one layer is located "on" the other layer or the substrate, it means that one layer can be directly formed on the other layer of the substrate or a third layer can be interposed therebetween. Like numbers refer to like elements throughout the specification.

Figure 3:
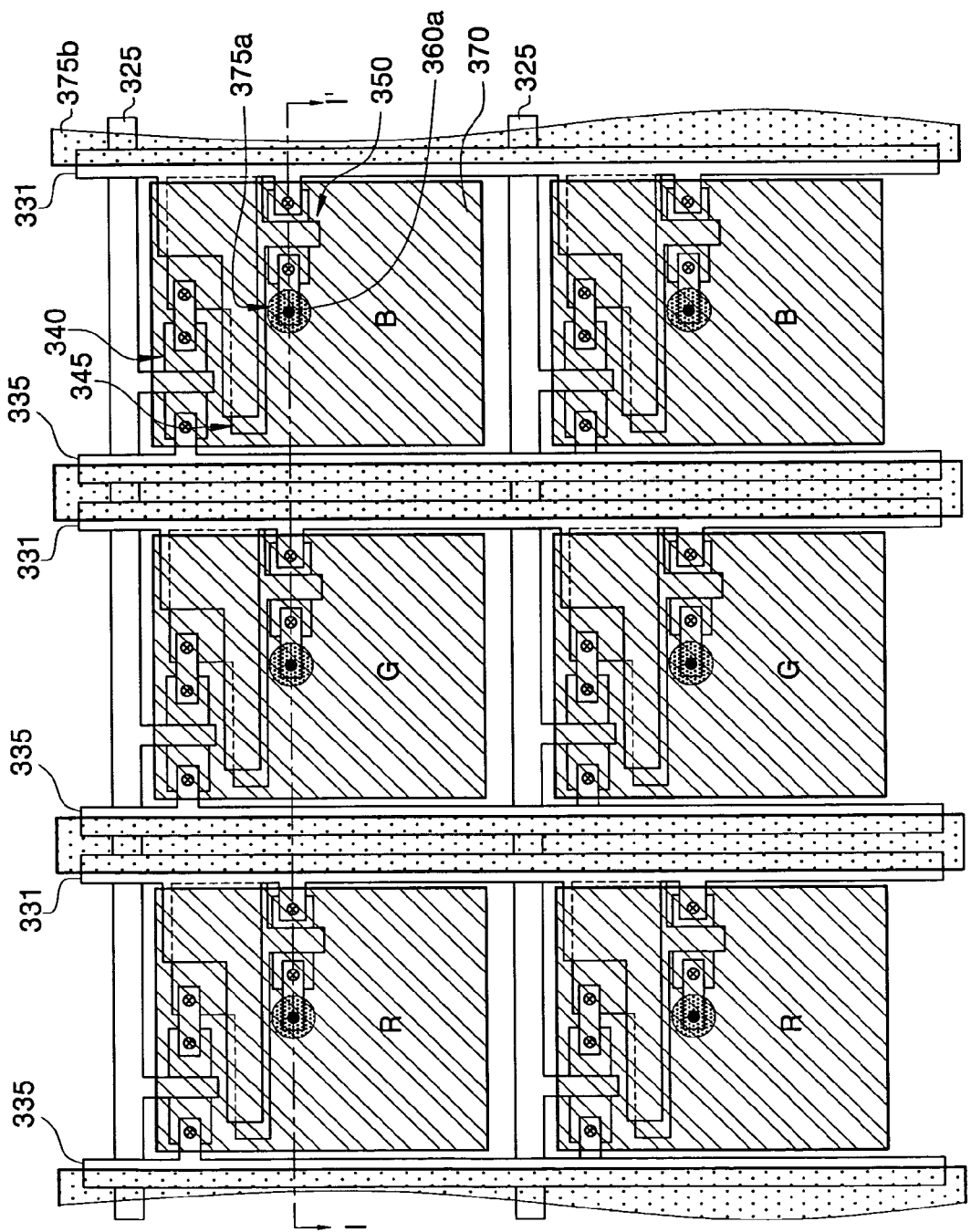
FIG. 3 is a plan view showing an organic light-emitting display according to a preferred embodiment of the present invention.

FIG. 3 is a plan view showing an organic light-emitting display according to an embodiment of the present invention.

Referring to FIG. 3, a scan line 325 is arranged in one direction. A data line 335 is insulated from and intersected with the scan line 325. A common power supply line 331 insulated from and intersected with the scan line 325, and disposed in parallel with the data line 335. A unit pixel region is defined by the intersection of the scan line 325 and the data line 335. The scan line 325 selects a unit pixel intended to be driven, and the data line 335 serves to apply a data signal to the selected unit pixel.

In each unit pixel region, there are located a switching thin film transistor 340 that switches the data signal applied to the data line 335 according to the signal applied to the scan line 325, a capacitor 345 that accumulates charges depending on a difference between the data signal, e.g. a data voltage, inputted through the switching thin film transistor 340 and a voltage applied to the common power supply line 331, and a pixel driving thin film transistor 350 that receives the signal for the charges accumulated in the capacitor 345 to send an electric current to the first electrode 370. The pixel driving thin film transistor 350 and the first electrode 370 are electrically connected with each other through a via-hole 360a. An emission layer (not shown) is located on the first electrode 370 and an opposite electrode (not shown) is located on the emission layer. With this, the first electrode 370, the emission layer, and the opposite electrode form an organic light-emitting diode. It is desirable that the first electrode 370 is also located on the thin film transistors 340, 350 and the capacitor 345 to improve an aperture ratio.

In a full color organic light-emitting display, the display may have a red unit pixel region R, a green unit pixel region G and a blue unit pixel region B, where a red emission layer is located on the red unit pixel region R, a green emission layer is located on the green unit pixel region G, and a blue emission layer is located on the blue unit pixel region B.

A first pattern 375a is located in the via-hole 360a. The first pattern 375a is protruded upward as compared with the first electrode 370 extended onto the via-hole insulating layer. Further, a second pattern 375b spaced apart form the first electrode 370 may be located in a stripe form at the right and left of the first electrode 370. Further, the second pattern 375b is protruded upward as compared with the first electrode 370 extended onto the via-hole insulating layer.

FIGS. 4A to 4E are cross-sectional views for illustrating an organic light-emitting display and a method of fabricating the same according to an embodiment of the present invention, taken along the line I–I' of FIG. 3.

Figure 4A:
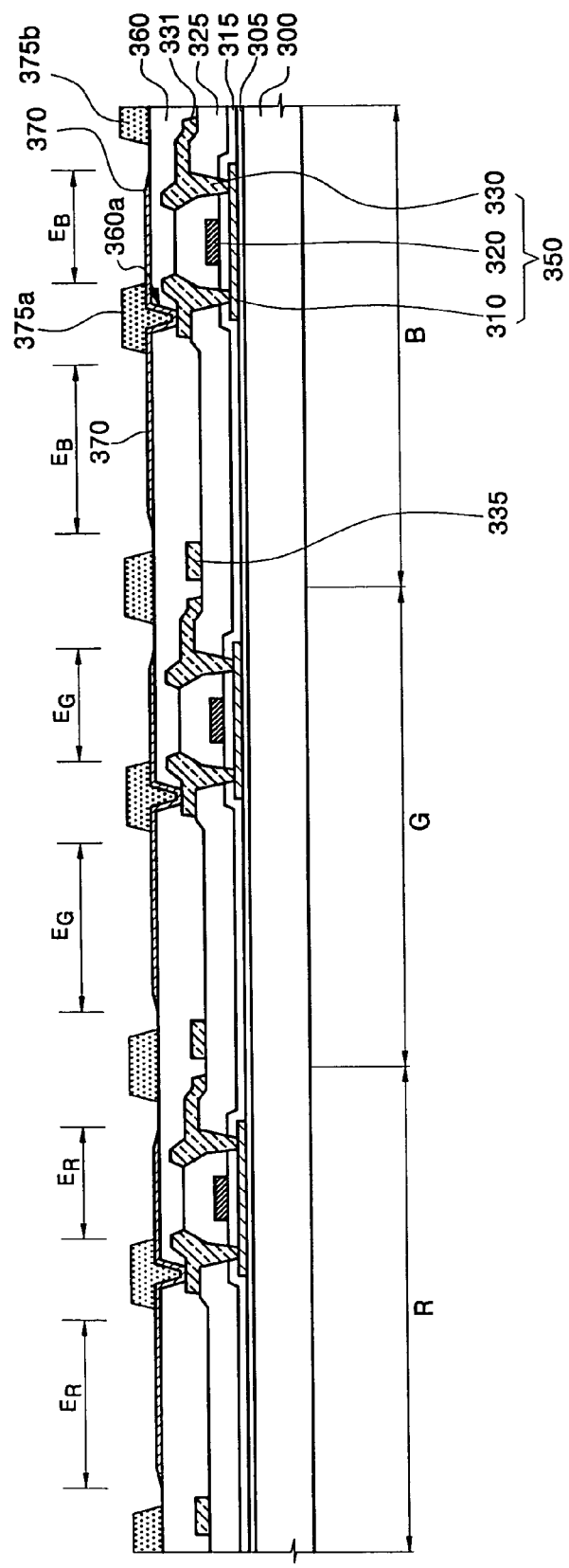

Referring to FIG. 4A, a substrate 300 having red R, green G and blue B unit pixel regions is provided. Preferably, a buffer layer 305 is formed on the substrate 300. An active layer 310, a gate insulating layer 315, a gate electrode 320, an interlayer 325 and source/drain electrodes 330 are formed on the buffer layer 305 by the conventional method. With this, a pixel driving thin film transistor 350 including the active layer 310, the gate electrode 320 and the source/drain electrodes 330 is formed on each unit pixel region. A data line 335 is simultaneously formed, while forming the gate electrode 320.

Next, a via-hole insulating layer 360 is formed on the substrate where the pixel driving thin film transistor 350 is formed, and a via-hole 360a that exposes one of the source/drain electrodes 330 of the pixel driving thin film transistor 350 is formed in the via-hole insulating layer 360. The via-hole insulating layer 360 can be an organic layer, an inorganic layer or a stacked layer thereof. When the via-hole insulating layer 360 is formed of the inorganic layer, it is desirable to be formed of a silicon nitride layer (SiNx), and when formed of the organic layer, it is desirable to be formed of BCB (benzocyclobutene). Further, when the via-hole insulating layer 360 is formed of the organic/inorganic stacked layer; it is desirable that the silicon nitride layer SiNx and the BCB (benzocyclobutene) are deposited and formed sequentially.

Next, a first electrode material is deposited on the substrate where the via-hole 360a is formed, and is patterned to form a first electrode 370 on each unit pixel region. With this, the first electrode 370 is located on the bottom of the via-hole 360a to contact with the exposed source/drain electrode 330, and is extended onto the via-hole insulating layer 360. Preferably, the first electrode 370 has a tapered edge. It is desirable that the taper has an angle of 20 degrees or less. Meanwhile, the first electrode 370 can be an anode or a cathode. If the first electrode 370 is an anode, it can be formed either by using ITO (Indium Tin Oxide) or IZO (Indium Zinc Oxide), or by sequentially depositing Al—Nd and ITO. When the first electrode 370 is a cathode, it can be formed of Mg, Ca, Al, Ag, Ba or an alloy thereof.

Next, a patterning layer to be patterned is formed on the entire surface of the substrate having the first electrode 370, to a thickness such that it can fully fill the via-hole 360a where the first electrode 370 is located. The patterning layer can be an organic layer or an inorganic layer, preferably, an organic layer. More preferably, the patterning layer can be a BCB (benzocyclobutene) layer, an acrylic-based polymer layer or an imide-based polymer layer. These organic layers have excellent flowability, so that the patterning layer can be formed to be flat on the entire surface of the substrate.

Next, the patterning layer is patterned to form a first pattern 375a. The first pattern 375a fills the via-hole 360a where the first electrode 370 is located, and is protruded upward as compared with the first electrode 370 extended onto the via-hole insulating layer 360, and the first electrode portion on which the first pattern 375a is not formed is exposed. That is, the first electrode 370 has a first part on which the first pattern is formed and a second part which is exposed. The exposed first electrode 370 defines an emission region. With this, a red emission region $E_R$ is defined in the red unit pixel region R, a green emission region $E_G$ is defined in the green unit pixel region G, and a blue emission region $E_B$ is defined in the blue unit pixel region B.

It is desirable that the first pattern 375a is formed 0.2 to 10 μm higher than the first electrode extended onto the via-hole insulating layer 360. When the first pattern 375a has a height less than 0.2 μm, it is not easy to fully fill the via-hole 360a, and when the first pattern 375a has a height above 10 μm, this results in excessive bending of a second electrode formed in the subsequent process. It is desirable that the first pattern 375a is formed to have a tapered edge on the first electrode 370 extended onto the via-hole insulating layer 360. Preferably, the taper has an angle of 45 degrees or less.

It is desirable that a second pattern 375b, which is spaced apart from the first electrode 370 at the right and left of the first electrode 370, is formed while the first pattern 375a is formed. Preferably, the second pattern 375b is 0.2 to 10 μm higher than the first electrode 370 extended onto the via-hole insulating layer 360. More preferably, the second pattern 375b has the same height as the first pattern 375a. This can be implemented by forming the patterning layer to be flat on the entire surface of the substrate.

Referring to FIG. 4B, an opening of a first fine metal mask 500a is aligned to the red unit pixel region R to adhere the first fine metal mask 500a to the first pattern 375a. When the second pattern 375b is formed, the first fine metal mask 500a is also adhered to the second pattern 375b. And then, a red light-emitting organic material is deposited through the opening of the first fine metal mask 500a, so that a red emission layer 400R is formed on the first electrode 370 of the red unit pixel region R. It is desirable that a first charge injection layer (not shown) and/or a first charge transport layer (not shown) are further formed on the first electrodes 370 of all unit pixel regions R, G, and B, before forming the red emission layer 400R.

Here, the first fine metal mask 500a is spaced apart from the first electrode 370 of the green emission region $E_G$ and the blue emission region $E_B$ due to the first pattern 375a. Therefore, the first electrode 370 is not contaminated by the first fine metal mask 500a.

Figure 4C:
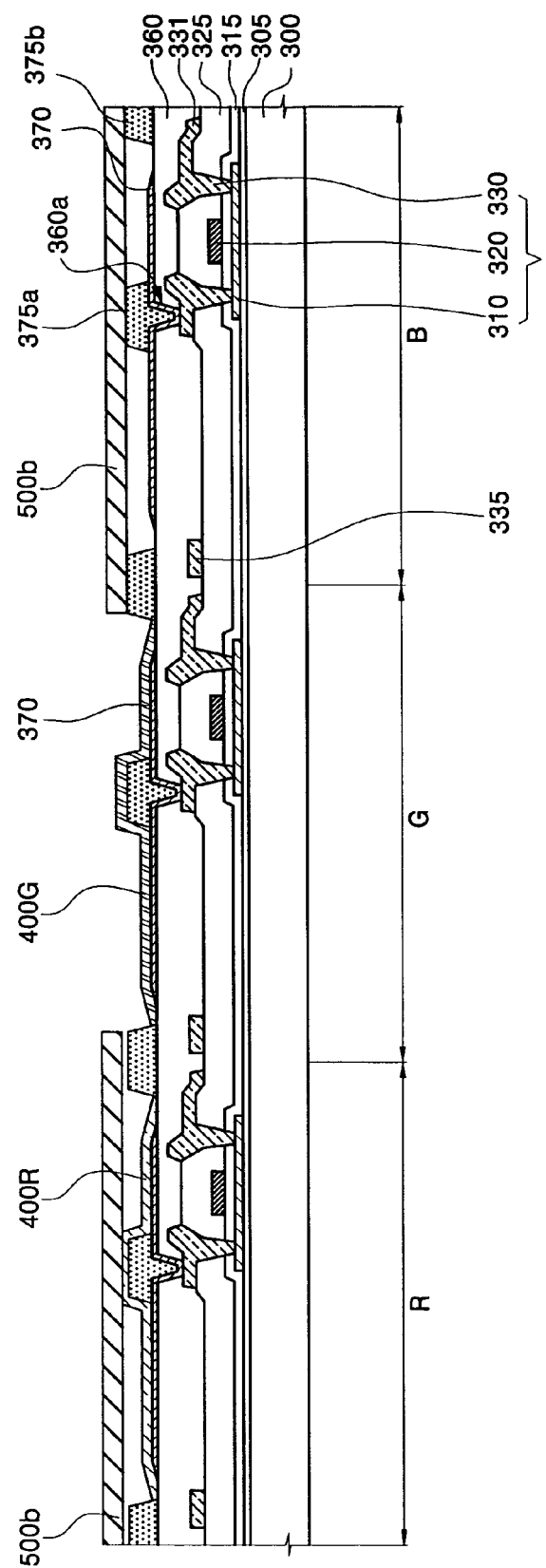

Referring to FIG. 4C, an opening of a second fine metal mask 500b is aligned to the green unit pixel region G, and the second fine metal mask 500b is adhered to the first pattern 375a. When the second pattern 375b is formed, the second fine metal mask 500b is also adhered to the second pattern 375b. And then, a green light-emitting organic material is deposited through the opening of the second fine metal mask 500b, so that a green emission layer 400G is formed on the first electrode 370 of the green unit pixel region G.

Here, the second fine metal mask 500b is spaced apart form the red emission layer 400R of the red emission region $E_R$ and the first electrode 370 of the blue emission region $E_B$ due to the first pattern 375a. Therefore, the red emission layer 400R of the red emission region $E_R$ and the first electrode 370 of the blue emission region $E_B$ are not contaminated by the second fine metal mask 500b, and also, the red emission layer 400R of the red emission region $E_R$ is not pressed. In this case, for the red unit pixel region R, the red emission layer 400R formed on the first pattern 375a is adhered to the second fine metal mask 500b, so that there occurs contamination or pressing, however, it is not a big problem since this is not an emission region.

Figure 4D:
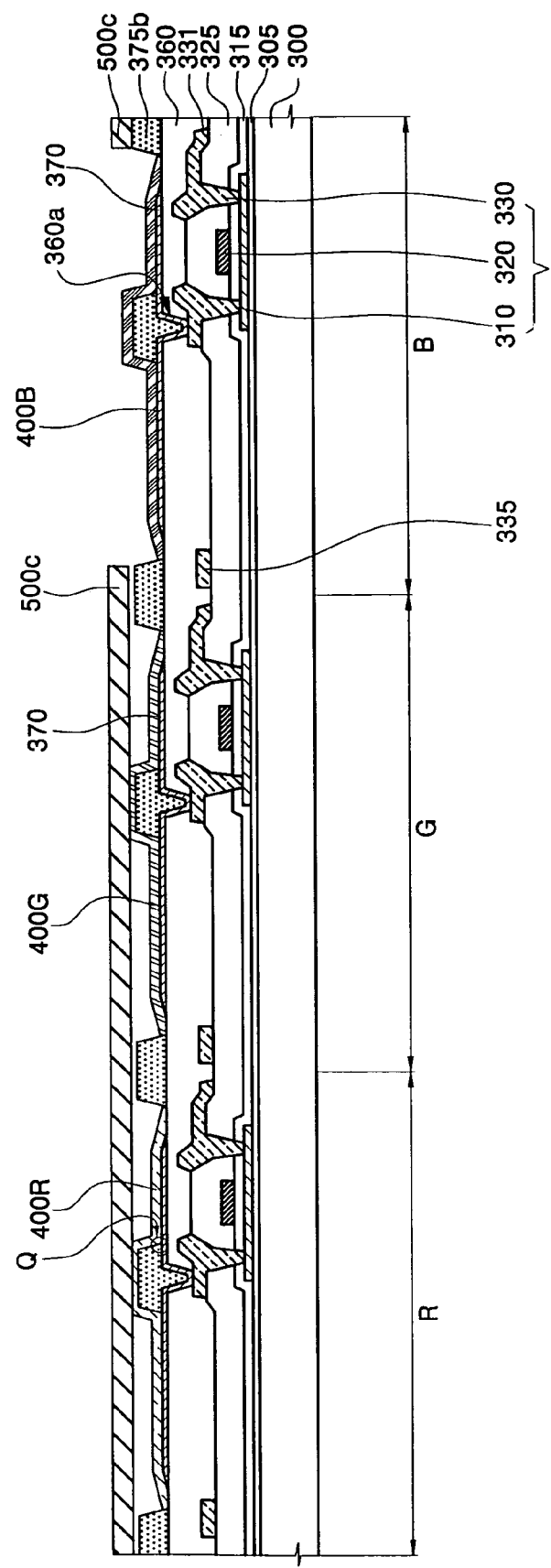

Referring to FIG. 4D, an opening of a third fine metal mask 500c is aligned to the blue unit pixel region B, and the third fine metal mask 500c is adhered to the first pattern 375a. When the second pattern 375b is formed, the third fine metal mask 500c is also adhered on the second pattern 375b. And then, a blue light-emitting organic material is deposited through the opening of the third fine metal mask 500c, so that a blue emission layer 400B is formed on the first electrode 370 of the blue unit pixel region B.

Here, the third fine metal mask 500c is spaced apart form the red emission layer 400R of the red emission region $E_R$ and the green emission layer 400G of the green emission region $E_G$ due to the first pattern 375a. Therefore, the red emission layer 400R of the red emission region $E_R$ and the green emission layer 400G of the green emission region $E_G$ are not contaminated or pressed by the third fine metal mask 500c. However, in this case, the red emission layer 400R and the green emission layer 400G formed on the first pattern 375a are adhered to the third fine metal mask 500c, so that there occurs the contamination or pressing, but it is not a big problem since this region is not an emission one.

As described above, by forming the first pattern 375a to fill the via-hole 360a where the first electrode 370 is located, it may be prevented for the emission layers 400R, 400G and 400B to be bent in the via-hole 360a.

And also, the first pattern 375a is formed in the via-hole and the first electrode portion on which the first pattern 375a is not formed is exposed to define an emission region. Therefore, the area of the first pattern 375a is minimized, so that the areas of the emission regions $E_R$, $E_G$, $E_B$ is extended compared with the conventional art as described referring to FIG. 1. As a result, an aperture ratio can be improved. And the contact areas between the emission layers 400R, 400G and 400B and the first pattern 375a can be reduced. Thereby, the deterioration of the emission layers 400R, 400G and 400B due to outgassing from the first pattern 375a formed of an organic layer can be minimized. Further, the first pattern 375a is formed to have a tapered edge, so that a failure in forming the emission layers 400R, 400G and 400B can be minimized at the edge Q of the first pattern 375a. Along with this, the first pattern 375a is protruded upward as compared with the first electrode 370 extended onto the via-hole insulating layer 360, so that, while forming the emission layers 400R, 400G and 400B using the fine metal masks 500a, 500b, 500c, the emission layers 400R, 400G and 400B and the first electrode 370 are not contaminated or pressed by the fine metal mask. The second pattern 375b serves to support the fine metal masks 500a, 500b, and 500c by assisting the first pattern 375a.

Referring to FIG. 4E, a second electrode 420 is formed on the emission layers 400R, 400G, and 400B. Preferably, a second charge transport layer and/or a second charge injection layer are formed on the emission layers 400R, 400G, and 400B, before forming the second electrode 420.

When the first electrode 370 is formed as an anode, the second electrode 420 is formed as a cathode, and when the first electrode 370 is formed as a cathode, the second electrode 420 is formed as an anode. The first electrode 370, the second electrode 420 and the organic layers interposed therebetween form an organic light-emitting diode.

FIGS. 5A to 5D are plan views showing an organic light-emitting display according to each of preferred embodiments of the present invention, in which only a first electrode, and a first pattern and a second pattern are shown.

Figure 5A:
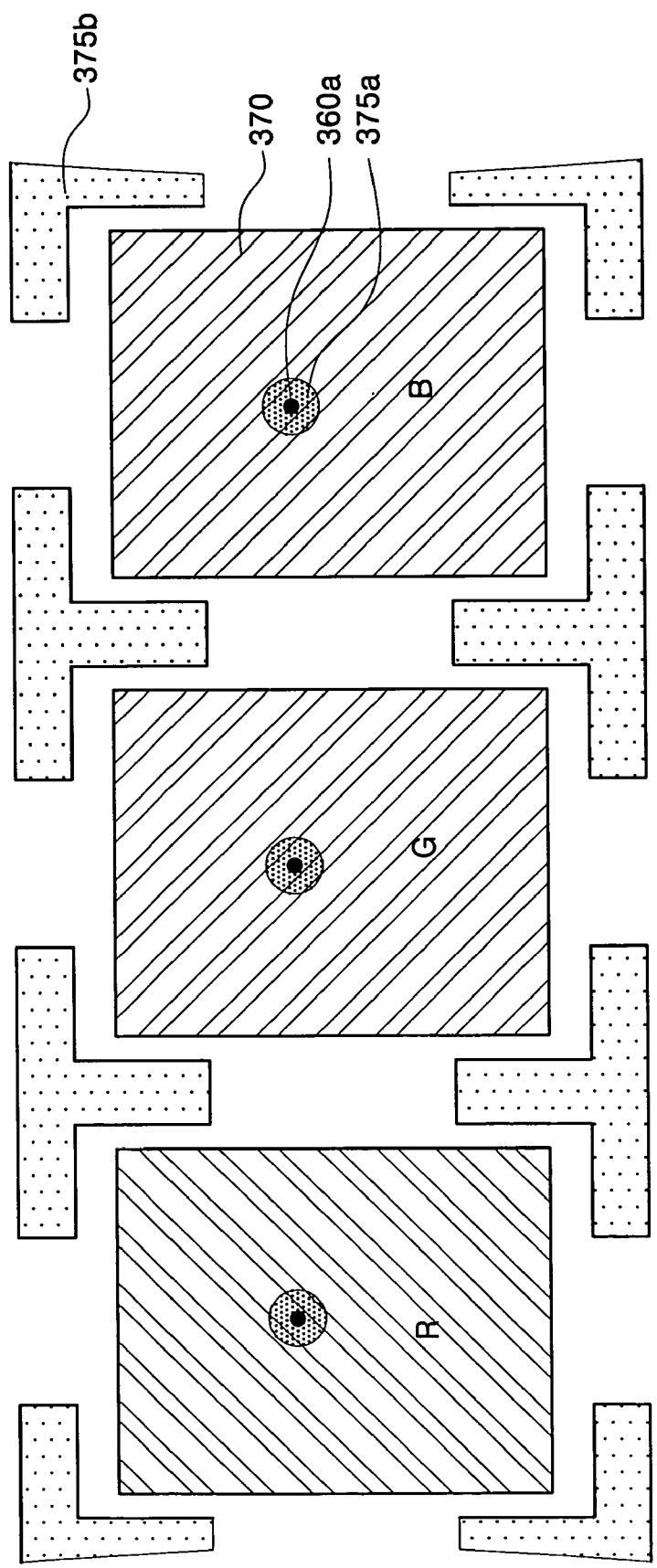

Referring to FIG. 5A, the first electrode 370 is overlapped with the via-hole 360a at its center. The first pattern 375a protruded upward as compared with the first electrode 370 is located on the first electrode 370, and is overlapped with the via-hole 360a. Further, the second pattern 375b is spaced apart from the first electrode 370 but surrounds four corners of the first electrode 370.

Figure 5B:
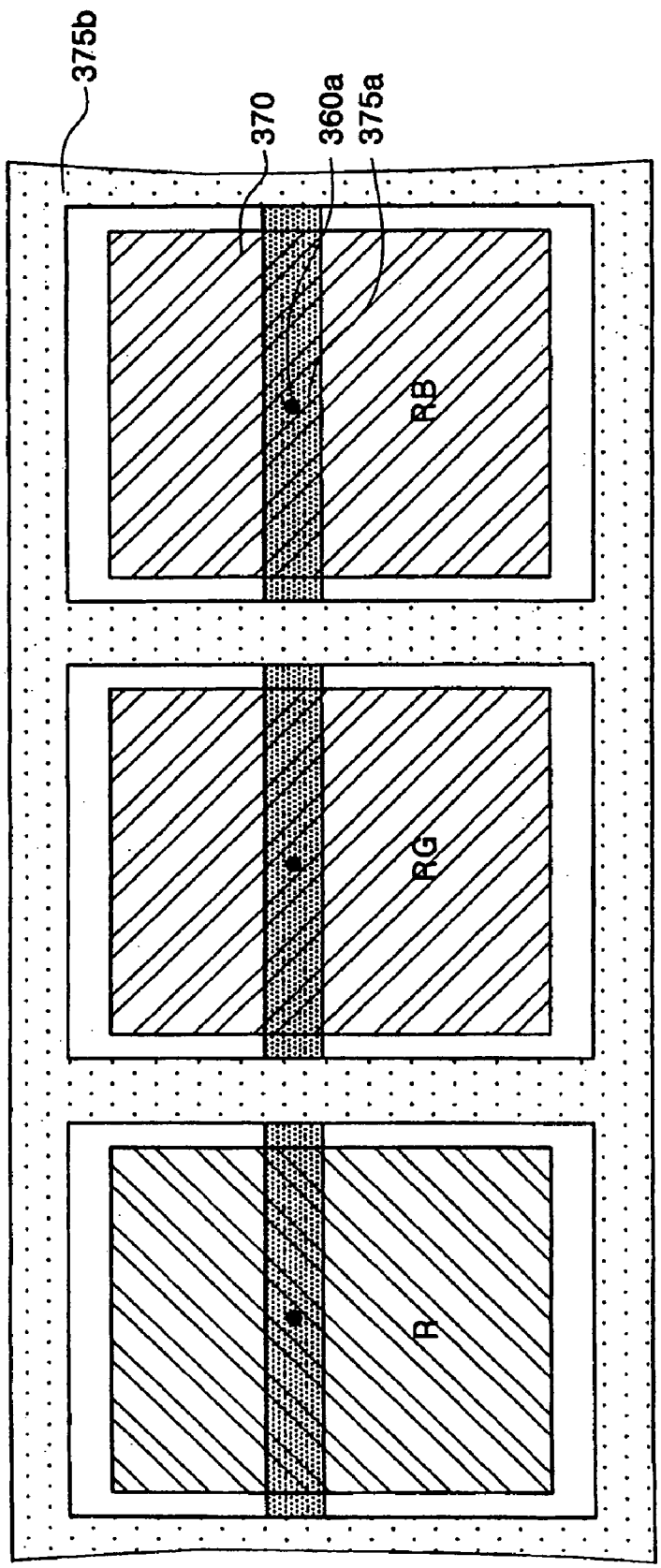

Referring to FIG. 5B, the first electrode 370 is overlapped with the via-hole 360a at its center. The second pattern 375b is spaced apart from the first electrode 370 but surrounds the first electrode 370, and the second pattern 375b is protruded upward as compared with the first electrode 370. Further, the first pattern 375a that is protruded upward as compared with the first electrode 370 is located on the first electrode 370 and is overlapped with the via-hole 360a. The first pattern 375a is extended to cross the first electrode 370, and thus, is connected to the second pattern 375b.

Referring to FIG. 5C, the first electrode 370 is overlapped with the via-hole 360a at its edge portion. The first pattern 375a that is protruded upward as compared with the first electrode 370 is located on the first electrode 370, and is overlapped with the via-hole 360a. Further, the second pattern 375b is spaced apart from the first electrode 370 but surrounds four corners of the first electrode 370, and is protruded upward as compared with the first electrode 370. Further, the first pattern 375a is connected to the second pattern 375b.

Referring to FIG. 5D, the first electrode 370 is overlapped with the via-hole 360a at its edge. The first pattern 375a that is protruded upward as compared with the first electrode 370 is located on the first electrode 370, and is overlapped with the via-hole 360a. Further, the second pattern 375b is spaced apart from the first electrode 370 but surrounds the first electrode 370, and is protruded upward as compared with the first electrode 370. Further, the first pattern 375a is connected to the second pattern 375b.

As described above, according to the present invention, the area of the first pattern is minimized, thereby preventing the deterioration of the emission layer due to the outgassing from the first pattern. Further, the first pattern is protruded upward as compared with the first electrode extended onto the via-hole insulating layer, thereby, in the process of forming the emission layer, preventing contamination of the first electrode and the emission layer which has already formed.

What is claimed is:

1. An organic light emitting display, comprising:
   a substrate having a unit pixel region;
   a thin film transistor located on the unit pixel region, said thin film transistor having a source electrode and a drain electrode;
   a via hole insulating layer located on the source electrode and the drain electrodes, said via hole insulating layer having a via hole that exposes one of the source electrode and the drain electrode;
   a first electrode overlapping with the via hole insulating layer and contacting with the exposed one of the source electrode and the drain electrode in the via-hole, said first electrode having a first part and a second part, said first part including at least a portion overlapping with the via hole;
   a first pattern formed on the first part of the first electrode and protruded upward as compared with the first electrode;
   a second pattern spaced apart from the first electrode, and protruded upward as compared with the second part of the first electrode, said second pattern not overlapping with the via-hole; and
   an emission layer located on the first electrode.

2. The organic light emitting display according to claim 1, wherein the second pattern is located at the right and the left of the first electrode.

3. The organic light-emitting display according to claim 1, wherein the second pattern has a form partially surrounding the first electrode.

4. The organic light emitting display according to claim 1, wherein the second pattern has a form surrounding all around the first electrode.

5. The organic light emitting display according to claim 1, wherein the second pattern and the first pattern are directly connected to each other.

6. The organic light emitting display according to claim 1, wherein the second pattern is protruded by about 0.2 to 10 μm as compared with the second part of the first electrode.

7. The organic light emitting display according to claim 1, wherein the first pattern has the same height as the second pattern.

8. The organic light emitting display according to claim 1, wherein the second pattern is an organic layer.

9. The organic light emitting display according to claim 8, wherein the organic layer is selected from the group consisting of a benzocyclobutene layer, an acrylic based polymer layer and an imide based polymer layer.

10. The organic light emitting display according to claim 1, wherein the first electrode has a tapered edge.

11. The organic light emitting display according to claim 10, wherein the tapered edge has a taper angle of 20° and less.

12. An organic light emitting display, comprising:
   a substrate having a unit pixel region;
   a thin film transistor located on the unit pixel region, said thin film transistor having a source electrode and a drain electrode;
   a via hole insulating layer located on the source electrode and the drain electrodes and having a via hole that exposes one of the source electrode and the drain electrode;
   a first electrode overlapping with the via hole insulating layer and contacting with the exposed one of the source electrode and the drain electrode in the via-hole, said first electrode having a first part and a second part, said first part including at least a portion overlapping with the via hole, said first electrode including a tapered edge with a taper angle of 20° or less;
   a first pattern formed on the first part of the first electrode and protruded upward as compared with the first electrode, said first pattern having a tapered edge with a taper angle of 45° or less;
   a second pattern spaced apart from the first electrode, the second pattern protruded upward as compared with the second part of the first electrode;

an emission layer located on the first electrode, said first pattern and said second pattern arranged to be capable of adhering to a mask when the mask is aligned to form the emission layer; and a second electrode formed directly on the second pattern and the emission layer.

* * * * *